(12) United States Patent
Hartmann et al.

(10) Patent No.: US 7,454,676 B2
(45) Date of Patent: Nov. 18, 2008

(54) METHOD FOR TESTING SEMICONDUCTOR CHIPS USING REGISTER SETS

(75) Inventors: Udo Hartmann, Neuried (DE); Jochen Kallscheuer, München (DE); Patric Stracke, München (DE)

(73) Assignee: Infineon Technologies AG, Neubiberg (DE)

( * ) Notice: Subject to any disclaimer, the term of this patent is extended or adjusted under 35 U.S.C. 154(b) by 415 days.

(21) Appl. No.: 11/288,416

(22) Filed: Nov. 29, 2005

(65) Prior Publication Data

US 2006/0156110 A1     Jul. 13, 2006

(30) Foreign Application Priority Data

Nov. 29, 2004     (DE) ................. 10 2004 057 532

(51) Int. Cl.
*G01R 31/28* (2006.01)
(52) U.S. Cl. ............... 714/726; 714/5; 714/25; 714/30; 714/42; 714/709; 714/715; 714/718; 714/719; 714/720; 714/722; 714/724; 714/727; 714/728; 714/729; 714/733; 714/734; 714/736; 714/738; 714/739; 714/742; 714/745; 365/201
(58) Field of Classification Search ........... None
See application file for complete search history.

(56) References Cited

U.S. PATENT DOCUMENTS

| | | | |
|---|---|---|---|
| 4,951,254 A | 8/1990 | Ontrop et al. | |
| 5,784,382 A * | 7/1998 | Byers et al. | 714/726 |
| 5,898,704 A * | 4/1999 | Kawano | 714/727 |
| 6,158,032 A * | 12/2000 | Currier et al. | 714/726 |
| 6,363,443 B1 * | 3/2002 | Whetsel | 710/104 |
| 6,574,762 B1 * | 6/2003 | Karimi et al. | 714/727 |
| 6,715,105 B1 * | 3/2004 | Rearick | 714/30 |
| 6,968,408 B2 * | 11/2005 | Joshi et al. | 710/110 |
| 7,139,946 B2 * | 11/2006 | Nadeau-Dostie et al. | 714/720 |
| 2002/0010878 A1 * | 1/2002 | Ernst et al. | 714/25 |
| 2003/0167431 A1 * | 9/2003 | Nicolaidis et al. | 714/733 |
| 2005/0240848 A1 * | 10/2005 | Cote et al. | 714/726 |
| 2006/0156108 A1 * | 7/2006 | Stracke et al. | 714/724 |

* cited by examiner

*Primary Examiner*—John P Trimmings
(74) *Attorney, Agent, or Firm*—Edell, Shapiro & Finnan, LLC

(57) ABSTRACT

A method for testing semiconductor chips having a test logic unit includes: providing a chip having n different register sets, each of which has m different registers that are subdivided into m register groups each having n registers, each register group respectively having only one individual register from a register set, the m register groups being uniquely identifiable using m headers; programming the m different register groups by filling them with m first bit strings, each bit string being respectively assignable to a state of n test modes; transmitting at least one header to select a register group and the state of the n test modes and executing the state of n test modes stored in the selected register group; and using a serial second bit string to read out test results or the status of the test modes.

19 Claims, 2 Drawing Sheets

METHOD FOR TESTING SEMICONDUCTOR CHIPS USING REGISTER SETS

CROSS REFERENCE TO RELATED APPLICATIONS

This application claims priority under 35 USC §119 to German Application No. DE 102004057532.0, filed on Nov. 29, 2004, and titled "Method for Testing Semiconductor Chips Using Register Sets," the entire contents of which are hereby incorporated by reference.

FIELD OF THE INVENTION

The present invention pertains to the field of fabrication of semiconductor chips, particularly memory chips, and relates to a method for testing semiconductor chips, in which a plurality of test modes are set in a chip which is to be tested, the test modes are carried out, and test results or the status of test modes (or the values of trimming test modes) are then output.

BACKGROUND

A fundamental part of the fabrication of semiconductor chips, particularly memory chips, is testing the quality of chips that have been fabricated. As part of quality assurance, tests are often carried out simultaneously on a multiplicity of chips as early as at the wafer level in order to be able to reject faulty chips or to initiate appropriate repair measures as early as possible.

In modern chip production, in conventional test methods, a multiplicity of test modes are loaded into the chips to be tested using a test unit, these test modes are executed, and the test results are output to the test unit. The test modes may be stored in the respective test unit; chips are often also equipped with a corresponding test logic unit in which, inter alia, various test modes may also be stored.

Currently, test modes are often set in the chip to be tested via a serial interface using a bit string in which respective bit sequences are respectively associated with a particular test mode. The bit string is used, for example, to activate/deactivate the test modes, or particular parameters are set in a respective test mode, thus making it possible to change a test mode or, for example, to activate/deactivate particular sub-functions of a test mode. In this case, a complete bit string which comprises the bit sequences for all of the test modes is always transmitted serially even if only a particular test mode needs to be performed or changed.

Due to the increasingly complex structure (associated with progressive miniaturization) of the chips, it is necessary to perform increasingly extensive tests for the requisite quality assurance. However, this results in the serially supplied bit strings generally becoming very long and in it consequently taking a very long time to set or change individual test modes or a plurality of test modes, which may, under certain circumstances, even become time-critical. This problem arises, above all, when one or more test modes are changed over a number of times during a test, which, in practice, may well be the case several thousand times per test. This means, in practice, that, owing to time problems, tests can often be performed only inadequately or cannot be performed at all, with the result that an increased proportion of defective chips which have reached the market can be expected. Furthermore, the very long bit strings which are required for complex chip structures cannot be handled by all test systems, since the bit length of all of the registers in a test system is limited by the hardware. This may lead to considerable overhead time during production.

SUMMARY

The present invention provides a method for testing semiconductor chips, particularly memory chips, which makes it possible to use serial interfaces to set or change test modes or to control test mode functions and read out the test results or the status of the test modes (or the values of trimming test modes) more rapidly or in a shorter period of time than conventional methods. In particular, the method involves testing semiconductor chips, particularly memory chips, in which a serial interface is used to set at least one test mode, generally a plurality of test modes, in a chip which is equipped with a test logic unit and is to be subjected to a test, the test modes are executed in the chip, and test results or the status of the test modes (or values of trimming test modes) is/are output from the chip using a serial interface.

When performing the method according to an exemplary embodiment of the invention, a chip which is to be tested is provided not only with a test logic unit but also with n different register sets, each of which has m different registers, n and m being natural numbers (integers) greater than or equal to 1. The registers, which may generally contain a plurality of bits, may be, by way of example but not by way of limitation, conventional latch memories in which only one bit can respectively be stored.

The registers are also subdivided into m register groups, each register group having n registers. The n registers in a register group stem from the registers in the register sets, each register group respectively having only one individual register from a register set, with the result that each register group has only one register from each register set. Each register group can be uniquely identified or addressed using a header or bit sequence.

The m different register groups are then programmed by filling them with m first (serial) bit strings using a serial interface. In other words, the n registers in a register group are filled with the logic values of the bits in a first serial bit string. In this case, each bit string may respectively be assigned a state (or parameter or signal values) of n test modes, i.e., each bit string fills the registers in a register group with the states of n test modes, one state belonging to each test mode. Each bit string (i.e., string of logic information units) consists of a plurality of logic values with each logic value identifying a state of a test mode. The bit string thus can be identified as a sequence of logic values with each logic value belonging to a specific state of a different test mode. Accordingly, a bit string of n bits can be used to program n states of n different test modes, i.e., a specific state of the n test modes (seen as a whole) stored in a single register group.

At least one header (or bit sequence) is then transmitted for the purpose of selecting a register group and the state (which is stored therein) of the n test modes to execute the state of the n test modes stored in the selected register group.

A serial second bit string is finally used to transmit the test results or the status of the test modes (or the values of trimming test modes) to the test unit, using a serial interface, in order to be evaluated.

Both the m first bit strings and the second bit string are composed of a sequence of binary bits, it being possible for bit sequences in a bit string to be assigned to at least one test mode or to at least one test mode function.

The method according to the invention thus advantageously makes it possible to store different states of the test modes (which can be selected by transmitting the respective headers) in the registers in the different register groups. In contrast to the conventional method, it is not necessary, when selecting different states of the test modes, to transmit a complete bit string for all of the test modes but rather it is merely necessary to transmit the appropriate header which corresponds to that register group in which the desired states of the test modes were initially stored. Since the bit length of the header (for example 4 bits) is generally much shorter than the bit length of a conventional complete bit string (for example 250 to 300 bits), which usually comprises all of the test modes, the method according to the invention makes it possible to save time for selecting the states of test modes. The method according to the invention merely presupposes that particular or determinable states of test modes are initially stored in the register groups. In order to select different states of test modes, transmission of a header is thus used merely to switch between the register groups. The method according to the invention can be used particularly advantageously for states of test modes between which there are frequent changes in the course of a test method.

In one advantageous refinement of the invention, the m first bit strings differ at least in the state of a test mode, i.e., there are no register groups which are the same as one another in all of the states of the test modes when the register groups have been appropriately filled with the m first bit strings, with the result that, each time another register group is selected, other states of test modes can be selected by transmitting a header.

The register groups may be reprogrammed, i.e., filled with other states of the test modes, at any time, even when carrying out a test method. It is equally possible for the register groups to be put into a definable initial state (default state).

In accordance with another advantageous refinement of the method according to the invention, at least one of the m first bit strings and/or the second bit string may be provided with at least one binary check bit. If the binary check bit is in a first of its two logic states (the check bit has not been "set"), which state is represented by the logic value "0", for example, the check bit causes the test logic unit to skip those bits in the relevant bit string which follow this check bit until the test logic unit detects another check bit in the relevant bit string, this check bit being in the other, second logic state, which is represented by the logic value "1", for example. On the other hand, if the binary check bit is in the second of its two logic states (the check bit has been "set"), this check bit causes the test logic unit not to skip those bits in the relevant bit string which follow this check bit and to read them in until the test logic unit detects another check bit in the bit string, this check bit being in the other, first logic state.

The method according to the invention thus advantageously makes it possible to use check bits to subdivide the entire bit string into a plurality of bit sequences, the bits in the respective bit sequences being skipped by the test logic unit or being read in by the test logic unit and output as a test result or as the status of the test modes (or values of trimming test modes), depending on the logic state of the check bits placed in front of the bit sequences. In other words, only the bits in the bit sequences having a check bit that has been set are read into the test logic unit, while the bits in the bit sequences having a check bit that has not been set are not read into the test logic unit, so that only particular or determinable test modes or test mode functions can be controlled without having to read all of the bits in the complete bit string into the test logic unit. Equally, when outputting test results, it is possible to set only those check bits which belong to those bit sequences for the test modes or test mode functions for which the test results are to be output.

Since the bits in the bit sequences having the check bits which have not been set can be skipped by the test logic unit both when inputting and when outputting the bit strings, it is thus possible, in an extremely advantageous manner, to save time when programming the register groups and when outputting the test results.

In the method according to the invention, the bit sequences having a check bit placed in front of them can be associated with one or more test modes, in which case it may be advantageous for the bits in a bit sequence having a check bit placed in front of it to be associated with only one individual test mode. The test modes can be activated/deactivated using the bits in the bit sequences which are associated with the test modes. It is equally possible for parameters of the test modes to be changed using the bits in the bit sequences which are associated with the test modes, as a result of which particular functions can be changed or particular subfunctions can be activated/deactivated.

Furthermore, in the method according to the invention, the bit sequences having a check bit placed in front of them may be associated with one or more test mode functions, in which case it may be advantageous for the bits in a bit sequence having a check bit placed in front of it to be associated with only one individual test mode function. The test mode functions can be activated/deactivated using the bits in the bit sequences which are associated with the test mode functions. It is equally possible for the test mode functions to be changed as a result.

In the method according to the invention, it may furthermore be advantageous for a check bit to be placed in front of the first and/or second bit string, thus making it possible to cause the bits in the complete bit string to be read in by the test logic unit or to be skipped by the test logic unit, depending on whether or not the check bit has been set. This may prove to be advantageous, for example, when a plurality of different bit strings are serially transmitted to the chip to be tested at the same time, or a plurality of different bit strings are output from the chip at the same time, but only individual bit strings of these bit strings are to be taken into account. In this case, the check bit can be placed in front of a bit string header that characterizes the bit string.

In the method according to the invention, a check bit can thus be placed in front of a complete bit string, thus causing the bits in the bit string to be read into/read out from the test logic unit or to be skipped by the test logic unit, depending on whether or not the check bit has been set. Furthermore, a check bit may be placed in front of one bit sequence, a plurality of bit sequences or all of the bit sequences which can be assigned to at least one test mode or to an individual test mode, thus causing the bits in the bit sequences to be read into/read out from the test logic unit or to be skipped by the test logic unit, depending on whether or not the check bit has been set. A check bit may also be placed in front of one bit sequence, a plurality of bit sequences or all of the bit sequences which can be assigned to at least one test mode function or to only one individual test mode function, thus causing the bits in the bit sequences to be read into/read out from the test logic unit or to be skipped by the test logic unit, depending on whether or not the check bit has been set. In the case of the last-mentioned measure, the expression "test mode functions" is also intended to include test mode subfunctions, i.e., further differentiations between test mode functions which are actually also test mode functions.

The above subdivision of the complete bit string into ever smaller bit sequences each having a check bit placed in front of them thus makes it possible for test modes or test mode functions to be controlled in a specific manner by setting only the check bits in the associated bit sequences. However, from the point of view of saving time when serially transmitting the bit string between a test apparatus and the chip to be tested, this subdivision of the bit string into ever smaller bit sequences is limited to the effect that at least one bit in a bit sequence can be skipped by the test logic unit. In this respect, it makes no sense to place a check bit (which has been set) in front of each bit in a bit string, since this does not save any time in comparison with the conventional serial transmission of a bit string. In other words, a bit sequence which is associated with a test mode or a test mode function should contain at least two bits.

The use of the method according to the invention is not restricted in any respect whatsoever. It shall be mentioned, merely by way of example, that the method according to the invention makes it possible to trim voltages or electric currents.

BRIEF DESCRIPTION OF THE DRAWINGS

The invention will now be explained in more detail using an exemplary embodiment, with reference being made to the appended drawings, in which.

DETAILED DESCRIPTION

Figure 1A:
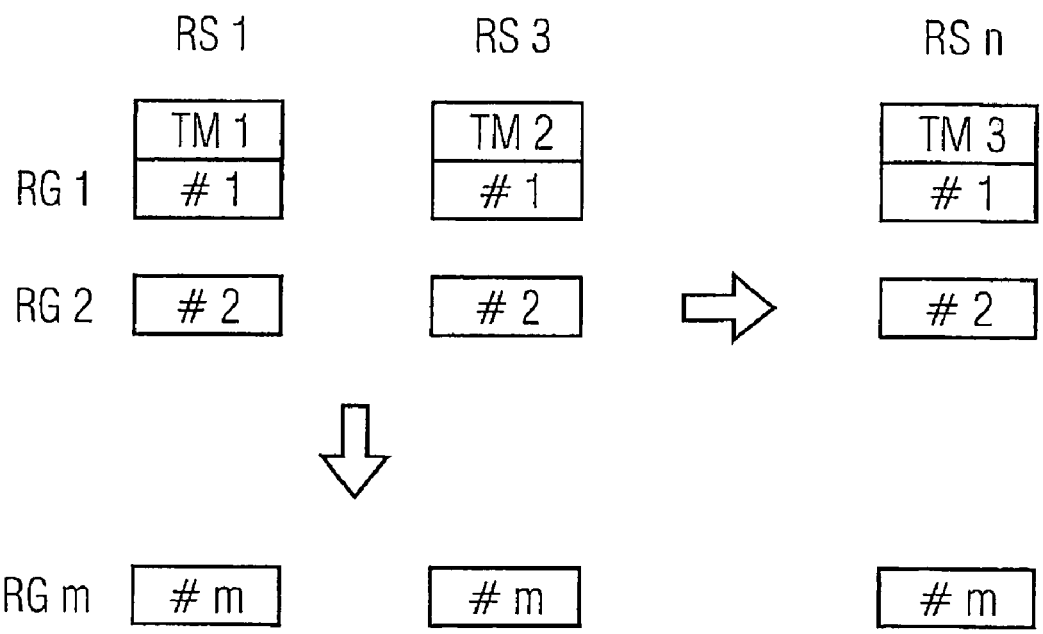
FIG. 1A schematically shows the register sets and register groups in the chip to be tested in accordance with an exemplary embodiment of the present invention.

FIG. 1A schematically shows the register sets and register groups in a chip to be tested. Accordingly, n register sets RS1, RS2, . . . , RSn each having m registers #1, #2, . . . , #m are provided. In this case, each register set is associated with a test mode TM. The registers are combined in m register groups RG1, RG2, . . . , RGm which can be uniquely identified or addressed using a header (not shown). In this case, each register group respectively contains only one individual register from a register set. The register arrangement may be compared with a matrix structure, the register sets corresponding to the columns of the matrix, while the register groups correspond to the rows of the matrix.

Figure 1B:
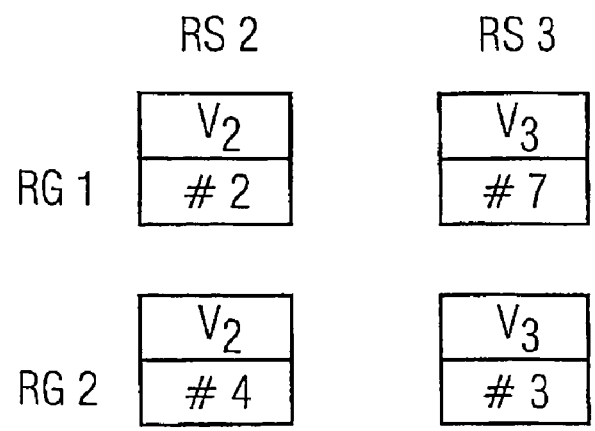
FIG. 1B schematically shows one exemplary embodiment of filling the register sets and register groups in the chip to be tested.

FIG. 1B schematically shows one exemplary embodiment of filling the register sets and register groups in the chip to be tested. In the exemplary embodiment, two register sets RS2 and RS3 which are associated with a voltage $V_2$ and a voltage $V_3$ are provided. A register group RG1, in which a state #2 for the voltage $V_2$ and a state #7 for the voltage $V_3$ are stored, and another register group RG2, in which a state #4 for the voltage $V_2$ and a state #3 for the voltage $V_3$ are stored, are furthermore provided.

Figure 2A:
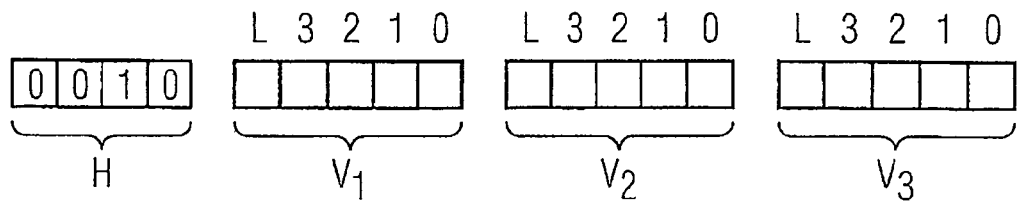
FIG. 2A schematically shows a bit string for three different voltages in accordance with an exemplary embodiment of the present invention.

FIG. 2A schematically shows a first bit string for three different voltages $V_1$, $V_2$, $V_3$, each of which is associated with a corresponding bit sequence. In this case, a check bit L is placed in front of each bit sequence. In addition, the bit string is provided with a header H for addressing the register group.

Figure 2B:
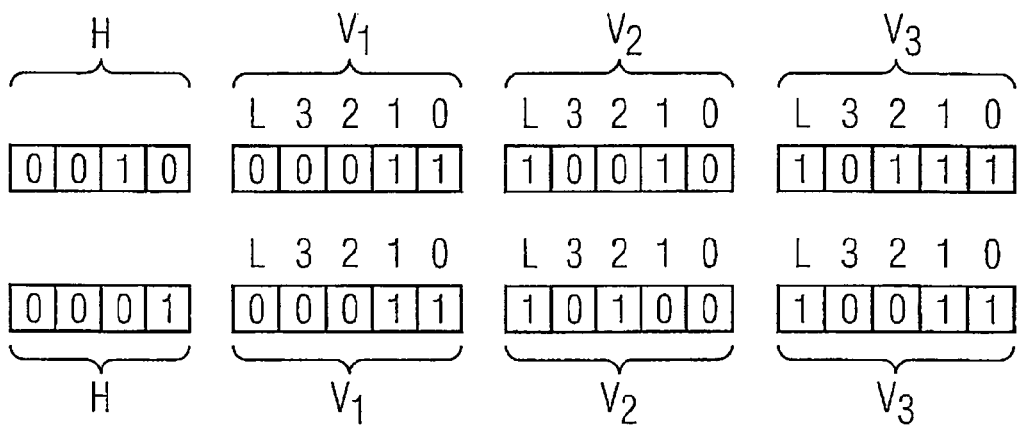
FIG. 2B schematically shows first bit strings for programming the register groups in accordance with an exemplary embodiment of the present invention.

FIG. 2B schematically shows two first bit strings for programming the register groups. In this case, three voltages are intended to be controlled, voltage $V_1$ being intended to remain constant, while the voltages $V_2$ and $V_3$ are changed. Serial transmission of the bit strings results in the register contents shown in FIG. 1B.

Figure 2C:
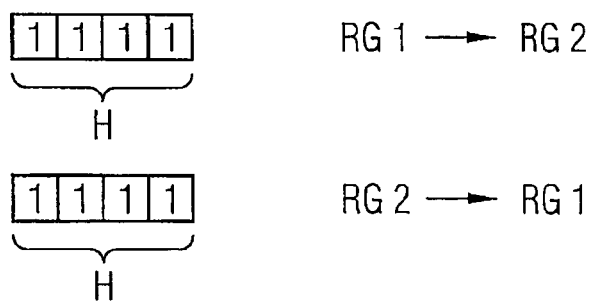
FIG. 2C schematically shows headers for changing over between register groups in accordance with an exemplary embodiment of the present invention.

FIG. 2C schematically shows headers for changing over between the register groups. The headers are interpreted by the test logic unit in such a manner that the register groups 2 and 3 are each cyclically interchanged. In other words, register group 2 is swapped with register group 1 and vice versa by applying a header as shown in FIG. 2C, and the state values (stored in the register groups) for the voltages $V_2$ and $V_3$ are used alternately (specialist expression "bump").

Figure 2D:
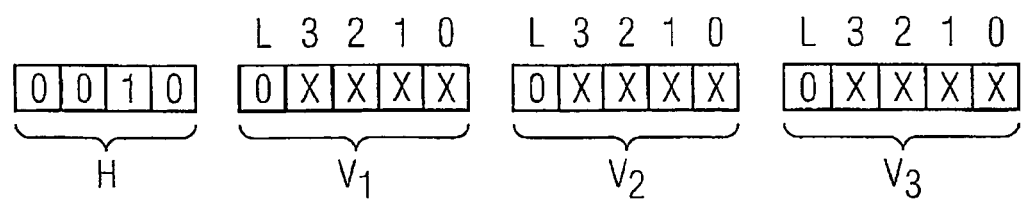
FIG. 2D schematically shows a bit string for resetting the registers to definable initial values in accordance with an exemplary embodiment of the present invention.

Finally, FIG. 2D schematically shows a bit string for resetting the registers to definable initial values, x being used to symbolically represent initial values.

In the method according to the invention, the states for the two voltages $V_2$ and $V_3$ can therefore be interchanged by transmitting only 4 bits of a header to the test logic unit. As is apparent in FIG. 2B, a bit string having a bit length of 19 bits would conventionally need to be transmitted in this example (in practice it is typical to transmit 250-300 bits).

When reading the registers, a header (start code) intended for this purpose would be sent to the chip and the information would be read from the registers.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method for testing semiconductor chips, in which at least one test mode is set in a chip which is to be tested and has a test logic unit, the test mode is executed in the chip, and a status of the test mode or test results are output from the chip, the method comprising:

provided the chip having n different register sets, each of which has m different registers that are subdivided into m register groups each having n registers, each register group respectively having only one individual register from a register set, the m register groups being uniquely identifiable using m headers, n and m being natural numbers greater than or equal to 1;

programming the m different register groups by filling the m different register groups with m first bit strings, each bit string being respectively assignable to a state of n test modes;

transmitting at least one header to select a register group and the state of the n test modes and executing the state of n test modes stored in the selected register group; and using a serial second bit string to read out the test results or the status of the n test modes, wherein at least one of the m first bit strings is provided with at least one binary check bit, a check bit in a first logic state being used to control the test logic unit such that those bits in a bit string that follows the check bit are skipped until another check bit in a second logic state is detected by the test logic unit, and a check bit in the second logic state being used to control the test logic unit such that those bits in a bit string that follows the check bit are not skipped until another check bit in the first logic state is detected by the test logic unit.

2. The method of claim 1, wherein the m first bit strings are different in the state of at least one test mode.

3. The method of claim 1, wherein the m register groups are put into a definable initial state by being filled with the m first bit strings.

4. The method of claim 1, wherein a check bit is placed in front of a bit sequence in the bit string that is associated with at least one test mode.

5. The method of claim 1, wherein a check bit is placed in front of a bit sequence in the bit string that is associated with an individual test mode.

6. The method of claim 1, wherein a check bit is placed in front of a bit sequence in the bit string that is associated with at least one test mode function.

7. The method of claim 1, wherein a check bit is placed in front of a bit sequence in the bit string that is associated with an individual test mode function.

8. The method of claim 1, wherein a check bit is placed in front of at least one bit string.

9. The method of claim 1, wherein a check bit is placed in front of all of the bit sequences that are associated with at least one test mode.

10. The method of claim 1, wherein a check bit is placed in front of all of the bit sequences that are associated with an individual test mode.

11. The method of claim 1, wherein a bit sequence that is associated with a test mode is used to activate and deactivate the test mode.

12. The method of claim 1, wherein a bit sequence that is associated with a test mode or test mode function is used to set parameters of the test mode.

13. A method for testing semiconductor chips, in which at least one test mode is set in a chip which is to be tested and has a test logic unit, the test mode is executed in the chip, and a status of the test mode or test results are output from the chip, the method comprising:

providing the chip having n different register sets, each of which has m different registers that are subdivided into m register groups each having n registers, each register group respectively having only one individual register from a register set, the m register groups being uniquely identifiable using m headers, n and m being natural numbers greater than or equal to 1;

programming the m different register groups by filling the m different register groups with m first bit strings, each bit string being respectively assignable to a state of n test modes;

transmitting at least one header to select a register group and the state of the n test modes and executing the state of n test modes stored in the selected register group; and using a second bit string to read out the test results or the status of the n test modes;

wherein the second bit string is provided with at least one binary check bit, a check bit in a first logic state being used to control the test logic unit such that those bits in a bit string that follows the check bit are skipped until another check bit in a second logic state is detected by the test logic unit, and a check bit in the second logic state being used to control the test logic unit such that those bits in the bit string that follows the check bit are not skipped until another check bit in the first logic state is detected by the test logic unit.

14. The method of claim 13, wherein a check bit is placed in front of a bit sequence in the bit string that is associated with at least one test mode or test mode function.

15. The method of claim 13, wherein a check bit is placed in front of a bit sequence in the bit string that is associated with an individual test mode or individual test mode function.

16. The method of claim 13, wherein a check bit is placed in front of at least one bit string.

17. The method of claim 13, wherein a check bit is placed in front of all of the bit sequences that are associated with at least one test mode or an individual test mode.

18. The method of claim 13, wherein a bit sequence that is associated with a test mode is used to activate and deactivate the test mode.

19. The method of claim 13, wherein a bit sequence that is associated with a test mode or test mode function is used to set parameters of the test mode.

* * * * *